United States Patent [19]
Asetta et al.

[11] Patent Number: 5,256,599
[45] Date of Patent: Oct. 26, 1993

[54] SEMICONDUCTOR WAFER WAX MOUNTING AND THINNING PROCESS

[75] Inventors: Paul D. Asetta, Mesa; Rajiv Bajaj, Gilbert; Lawrence R. Gardner; Michael P. Norman, both of Chandler; James J. Wang, Tempe, all of Ariz.

[73] Assignee: Motorola, Inc., Schaumburg, Ill.

[21] Appl. No.: 891,111

[22] Filed: Jun. 1, 1992

[51] Int. Cl.$^5$ ................. H01L 21/302; H01L 21/463
[52] U.S. Cl. ........................ 437/225; 437/231; 437/248; 437/946; 51/131.5; 51/277
[58] Field of Search ................. 437/225, 226; 156/345; 51/277, 129, 236, 131.4, 131.5

[56] References Cited
U.S. PATENT DOCUMENTS

| | | | |
|---|---|---|---|
| 3,970,494 | 7/1976 | Pritchard | 156/155 |
| 3,979,239 | 9/1976 | Walsh | 156/4 |
| 4,316,757 | 2/1982 | Walsh | 51/277 |
| 4,512,113 | 4/1985 | Budinger | 51/236 |

Primary Examiner—Olik Chaudhuri
Assistant Examiner—H. Jey Tsai
Attorney, Agent, or Firm—Joe E. Barbee

[57] ABSTRACT

A wax (13) dissolved in solvent is placed on a semiconductor wafer (12) and made uniform. An assembly is formed by bonding the semiconductor wafer (12) to a submount (17) with a uniform wax layer (14). The submount (17) supports and allows handling of the semiconductor wafer (12) during wafer process steps. The assembly is heated in a vacuum to remove solvent and air trapped in the uniform wax layer (14) thereby minimizing air voids which can cause a non-uniform bond. The assembly is then annealed to reduce stress on the semiconductor wafer (12) induced by differing material thermal expansion rates of the semiconductor wafer (12), the uniform wax layer (14), and the submount (17).

15 Claims, 2 Drawing Sheets

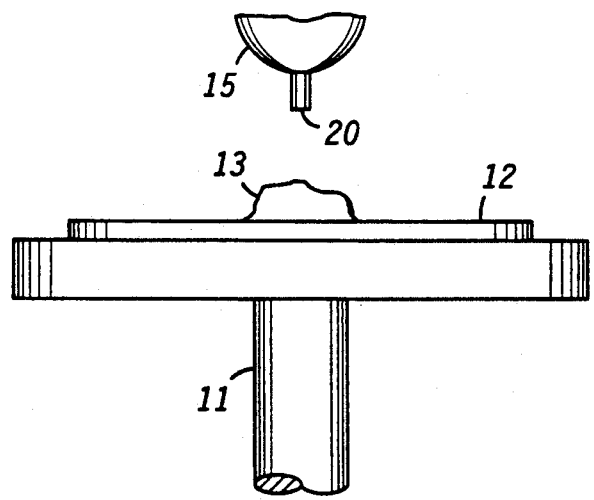
FIG. 1
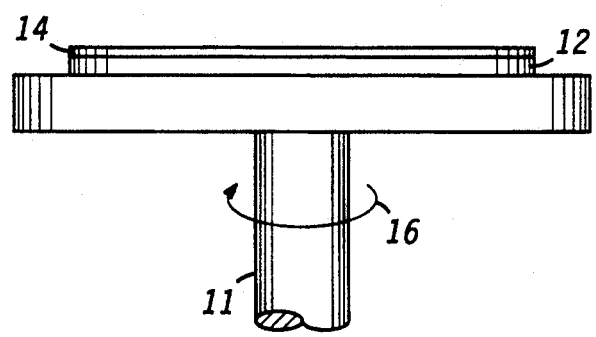
FIG. 2
FIG. 3
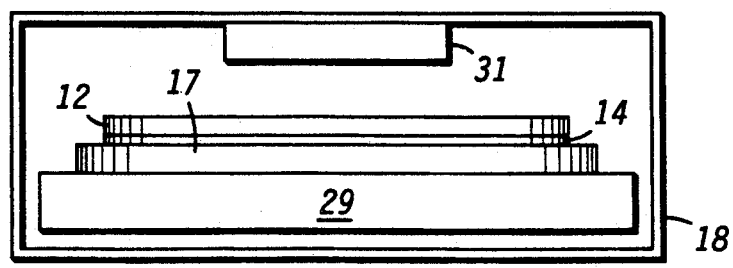

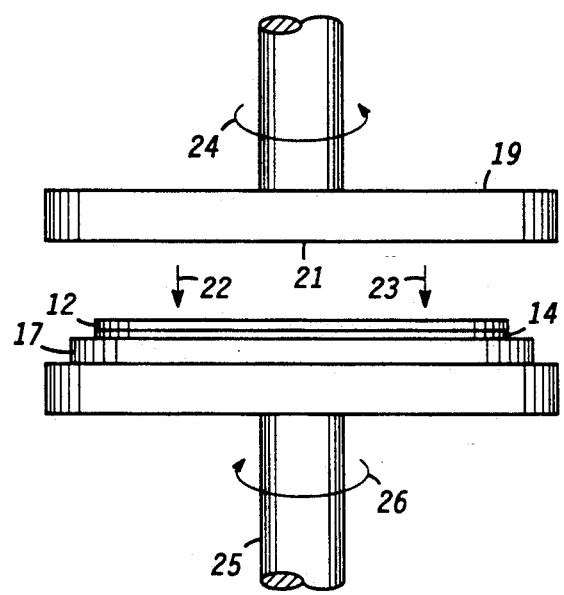
FIG. 4
FIG. 5
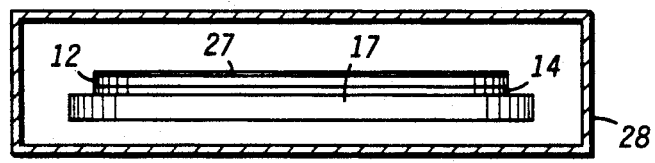
FIG. 6
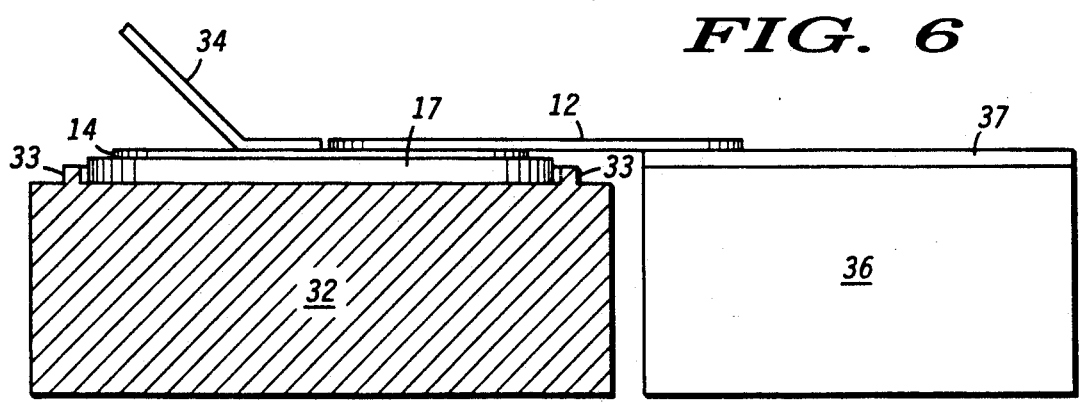

SEMICONDUCTOR WAFER WAX MOUNTING AND THINNING PROCESS

BACKGROUND OF THE INVENTION

This invention relates, in general, to handling semiconductor wafers during wafer processing, and more particularly to mounting a semiconductor wafer onto a submount to reduce unsupported semiconductor wafer handling during wafer processing.

A semiconductor chip operated at extremely high speeds tends to dissipate large amounts of heat. If large power devices are present on the semiconductor chip, it is essential to operate them at a temperature as low as possible. Lowering the operating temperature of the semiconductor chip will benefit operation by increasing frequency response due to higher carrier mobility and reduced parasitic resistances. It will also increase reliability and reduce the chance of a semiconductor chip failing in the field by reducing heat stress.

Gallium arsenide and other compound semiconductors are poor thermal conductors. To maximize heat transfer, a gallium arsenide semiconductor chip is made as thin as possible. A heat sink can be coupled to the semiconductor chip to remove heat from the semiconductor chip.

Gallium arsenide wafers used for fabricating semiconductor chips are extremely brittle and prone to breakage when handled during wafer processing. This fact is further complicated when a gallium arsenide wafer is thinned to increase thermal transfer through the wafer. How the wafer is handled during a wafer thinning process, controlling uniformity of wafer thickness, handling the wafer after it has been thinned, and further processing through high temperature backmetal deposition are only a few of the problems which must be dealt with in gallium arsenide wafer processing.

Solutions for these problems revolve around mounting the gallium arsenide wafer to a submount. The submount is used to handle the wafer during wafer process steps and to provide support or rigidity to the gallium arsenide wafer. This increases processing yields by preventing gallium arsenide wafer fracturing. An adhesive material or bonding material is needed to bond the gallium arsenide wafer to the submount.

The submount is typically made of glass, quartz, sapphire, metal, alumina, gallium arsenide, or silicon. Some of these submount materials will induce stress to the gallium arsenide wafer when bonded together due to different material thermal expansion rates. Temperature changes cause the submount, bonding material, and the gallium arsenide wafer to expand or contract by different amounts. The different rates of expansion or contraction induce stress on the gallium arsenide wafer causing it to bow or warp. Grinding a warped gallium arsenide wafer to reduce wafer thickness under these conditions will not yield a wafer having a uniform thickness.

There are a number of adhesives commonly used to bond semiconductor wafers to a submount. The bond formed, however, must now be strong enough to withstand the grinding process, plus not liquify, sublimate, or wash away during subsequent wafer process steps. Also, the bond must be easily broken to remove a thinned gallium arsenide wafer after the processing steps have been completed.

Wax is a very good choice for bonding material in a production environment because it is simple to apply and control. Two major drawbacks in using wax are developing a methodology for applying the wax in a production environment and the fact that wax has a low liquifying point which cannot withstand high temperature wafer process steps. Ideally, a wax bond between the gallium arsenide wafer and submount must have a constant or uniform thickness throughout the bond to minimize error when reducing wafer thickness.

Wax application to form a bond is very crude and does not lend itself to a production environment. Wax shavings are melted in a crucible. The melted wax is poured onto the submount. The gallium arsenide wafer and the submount are pressed together while the wax is hot. After the wax has cooled and formed an assembly comprising the gallium arsenide wafer and the submount, the assembly is measured to determine the uniformity of the wax layer forming the bond. If the wax layer varies more than 3 microns in thickness causing the gallium arsenide wafer to be mounted on an angle, the assembly will be reheated and pressure will be applied to even the wax layer. This procedure to achieve a uniform wax bond is cumbersome and time consuming.

A common processing step is metallization of a surface of the gallium wafer after the wafer has been thinned. Metallization of a surface of a semiconductor chip allows soldering or eutectic bonding to the surface for attaching the semiconductor chip to a heat sink or package. A preferred approach is metal sputtering which yields better metal coverage and better metal adhesion to the wafer than metal evaporation. Metal sputtering is performed at temperatures which liquify most commonly used waxes.

It would be a great advantage if a wafer mounting process could be developed which forms a strong bond, does not liquify at wafer process temperatures, will not bow or warp the gallium arsenide wafer significantly, and where the bonding material has a uniform thickness, yet is simple to apply and later remove in a production environment.

SUMMARY OF THE INVENTION

Briefly stated, this invention comprises an assembly comprising a semiconductor wafer bonded to a submount using a wax dissolved in solvent as a bonding material.

One method for fabricating the assembly which minimizes stress on the semiconductor wafer is to heat the assembly in a vacuum to remove trapped air in the wax and then anneal the assembly to reduce stress caused by different material thermal expansion coefficients of the semiconductor wafer, the submount, and the wax.

BRIEF DESCRIPTION OF THE DRAWINGS

FIG. 1 is an illustration of a rotating vacuum chuck, holding a semiconductor wafer;

FIG. 2 is a further illustration of the vacuum chuck of FIG. 1 showing a formation of a uniform wax layer;

FIG. 3 is an illustration of a semiconductor wafer bonded to a submount;

FIG. 4 is an illustration of a semiconductor wafer being thinned;

FIG. 5 is an illustration of metal sputtered on a surface of a semiconductor wafer; and FIG. 6 is an illustration of a thinned semiconductor wafer being removed from a submount.

DETAILED DESCRIPTION OF THE DRAWINGS

FIG. 1 is an illustration of a rotating vacuum chuck 11, holding a semiconductor wafer 12. In the preferred embodiment, semiconductor wafer 12 is a III-V compound semiconductor wafer such as gallium arsenide. A wax 13 is deposited on a surface of semiconductor wafer 12.

Wax 13 is dissolved in a solvent or other chemical to keep it in a semi-liquid format which is easily applied to the wafer surface. A predetermined quantity of wax 13 can be dispensed in this semi-liquid form through a dispenser 15. The size of orifice 20 of dispenser 15, dispense pump pressure, and dispension time allows accurate control of the amount of wax placed on semiconductor wafer 12. Although initially centrally located in FIG. 1, wax 13 is dispensed over approximately 25% of a surface of semiconductor wafer 12 and will spread out on the wafer surface with time. Approximately 3 ml of wax 13 is dispensed on a 100 mm wafer to produce 25% coverage.

In a preferred embodiment wax 13 comprises Waxivation (trade name) sold by Olin Hunt Specialty Products. Olin Hunt Specialty Products is located at 2873 N. Nevada St. Chandler, Ariz. 85225. Waxivation has several properties which make it ideal for use as a mounting wax. First, Waxivation is in a semi-liquid state (dissolved in a solvent) which simplifies application to a semiconductor wafer. Second, Waxivation is non-water soluble, this allows wax 13 to be used in wafer process steps where water is used (such as wafer thinning) to clean semiconductor wafer 12. Third, Waxivation has a liquifying point between 140 to 160 degrees Celsius which is adequate for many high temperature wafer process steps. Fourth, Waxivation has adhesion properties which form a strong bond between the gallium arsenide wafer and a submount. The strong bond is necessary for process steps such as wafer thinning using a grinder. Fifth, Waxivation flows (slightly) down to 90 degrees Celsius (or less) thereby allowing use of submount materials with material thermal expansion coefficients close to semiconductor wafer 12. Sixth, the wax bond is weakened simply by heating wax 13. Finally, Waxivation is easily removed from the semiconductor wafer using a solvent.

Preferably, semiconductor wafer 12 is a 100 millimeter diameter wafer. Initially, before any processing has taken place, wafer 12 is 625 microns thick with a tolerance of plus or minus 20 microns. Variations in thickness across wafer 12 are monitored, specifications for wafer thickness variations are plus or minus 2 microns. Gallium arsenide wafers are known to be extremely brittle and wafer 12 handling is kept to a minimum to reduce the chance of breakage during wafer process steps. Semiconductor wafer 12 is subject to being stressed during wafer process steps in which semiconductor wafer 12 is not mounted on a submount. This may cause small fractures to develop in semiconductor wafer 12 which lead to breakage when wafer 12 is thinned.

FIG. 2 is an illustration of vacuum chuck 11 spinning semiconductor wafer 12 to form a uniform wax layer 14. The rotation of vacuum chuck 11 is indicated by arrow 16.

Spinning semiconductor wafer 12 spreads wax 13 (of FIG. 1) over the wafer surface and forms uniform wax layer 14. Most of the solvent in wax 13 is released while wafer 12 is spinning. The amount of wax placed on semiconductor wafer 12 and the spin rate of vacuum chuck 11 determines the thickness of uniform wax layer 14. In the preferred embodiment, 3 ml of wax 13 is placed on semiconductor wafer 12 (having a diameter of 100 mm). Vacuum chuck 11 is then spun at 2000 revolutions per minute for 15 seconds. Uniform wax layer 14 formed from the spin is on average 13 microns thick. Measurements on uniform wax layer 14 have shown variations in thickness of plus or minus 1 micron.

Solvent can be trapped in uniform wax layer 14 if semiconductor wafer 12 is bonded to a submount. This trapped solvent can form solvent pockets in uniform wax layer 14. If a heating step is performed on semiconductor wafer 12 bonded to a submount by uniform wax layer 14, solvent in uniform wax layer 14 may start to vaporize. Solvent vapor expansion in uniform wax layer 14 due to the heating may rupture the bond formed by wax 14 in areas of the solvent pockets and may be powerful enough to fracture semiconductor wafer 12 as solvent vapor is released. Thus it is essential to reduce solvent content from uniform wax layer 14 prior to mounting semiconductor wafer 12 to a submount to prevent damage to semiconductor wafer 12.

Semiconductor wafer 12 and uniform wax layer 14 is heated to reduce solvent content. In the preferred embodiment, semiconductor wafer 12 is placed on a heating plate for 30 seconds at 150 degrees Celsius. The heat softens uniform wax layer 14 allowing solvent to vaporize and escape from uniform wax layer 14. This step does not significantly affect the uniformity of uniform wax layer 14 due to the short duration of the heat cycle.

An alternate embodiment is to spin a uniform wax layer on a submount instead of semiconductor wafer 12. It may also be beneficial to spin a uniform wax layer on both the submount and semiconductor wafer 12. Spinning wax to form uniform layer wax 14 is ideal for a production environment because the process is very simple, allows high throughput, and provides a wax layer with small variations in wax thickness.

FIG. 3 illustrates semiconductor wafer 12 placed on a submount 17 with uniform wax layer 14 bonding the two together. Submounts have been made of glass, quartz, sapphire, and metal. In the preferred embodiment, submount 17 is a 125 mm diameter silicon wafer. Silicon wafer submount 17 has a larger diameter than semiconductor wafer 12 (100 mm diameter) to simplify handling. Semiconductor wafer 12 is centrally located on silicon wafer submount 17 which allows handling at a periphery of submount 17 without contact to semiconductor wafer 12. Semiconductor wafer 12 bonded to silicon wafer submount 17 forms an assembly which allows utilization of standard cassette to cassette type equipment, thus minimizing equipment changes which might be required for wafer processing steps.

Raw gallium arsenide wafers are more expensive than standard silicon wafers. Further, most of the device process steps have been completed in the wafer prior to semiconductor wafer 12 being bonded to silicon wafer submount 17. Thus, further increasing wafer 12 value. Because semiconductor wafer 12 is extremely brittle excessive handling of wafer 12 might lead to breakage, thereby reducing yields and increasing costs. The larger diameter of silicon wafer submount 17 allows an assembly of silicon wafer 17 and semiconductor wafer 12 to be handled as a unit without fear of breakage. Any wax which does not form a bond between semiconductor wafer 12 and silicon wafer submount 17 is removed with solvent prior to any further wafer process steps.

Uniform wax layer 14 does not form an adequate bond simply by placing semiconductor wafer 12 onto silicon wafer submount 17. Air can be trapped in uniform wax layer 14 forming voids where no wax bond occurs. If the resultant air voids are left within uniform wax layer 14 a non-uniform bond between semiconductor wafer 12 and silicon wafer submount 17 is formed. Stress variations due to the non-uniform bond warps semiconductor wafer 12 presenting an uneven surface for wafer processing steps. This is unacceptable for a wafer process step such as grinding wafer 12 where variations in thickness of the uniform wax layer 14 will yield a thinned wafer having a non-uniform thickness. This problem is solved by heating the assembly in a vacuum which reduces air voids trapped in uniform wax layer 14. Heating semiconductor wafer 12, uniform wax layer 14, and silicon wafer submount 17 softens uniform wax layer 14 to allow trapped air to move more freely through uniform wax layer 14. The vacuum creates a force on trapped air in uniform wax layer 14. The trapped air migrates towards the periphery of uniform wax layer 14 and eventually exits through an edge of uniform wax layer 14 not bounded by silicon wafer submount 17 or semiconductor wafer 12. Heating and vacuum steps are controlled to minimize changes to uniform wax layer 14.

A wax bond having a uniform thickness is formed by placing the assembly comprising silicon wafer submount 17 and semiconductor wafer 12 in a vacuum heating chamber 18. A "Branson Asher 18", Model #IPCL3300 is used to create a bond without air or solvent pockets. Five steps are used in the formation of the wax bond. "Branson Asher 18" has a nitrogen atmosphere pumped through the system at 30 standard cubic centimeters per minute during the process. The nitrogen does not play a role in the bond formation.

Step one comprises turning on a heating plate 29 to a temperature of 100 degrees Celsius which heats submount 17 under a vacuum setting of 6.797 kilograms per square meter for 10 seconds. Heating plate 29 is held at a temperature of 100 degrees Celsius during all five steps.

Step two comprises turning on a heating lamp 31 at 15% power, changing the vacuum setting to 9.516 kilograms per square meter, and continuing step two for 30 seconds. Heating lamp 31 in "Branson Asher 18" is not calibrated for a specific power output but only a percentage of total lamp output. Heat generated by heating lamp 31 is measured by a thermometer in "Branson Asher 18". Temperature in "Branson Asher 18" during step two is approximately 140 degrees Celsius.

Step three comprises no change in vacuum setting (9.516 kilograms per square meter) but increasing heating lamp 31 setting to 20% power for a time period of one minute and thirty seconds. Temperature in "Branson Asher 18" during step three is approximately 150 degrees Celsius.

Step four comprises no change in vacuum setting (9.516 kilograms per square meter) but increasing heating lamp 31 setting to 25% power for a time period of one minute and thirty seconds. Temperature in "Branson Asher 18" during step four is in excess of 150 degrees Celsius.

Step five is a cool down step where "Branson Asher 18" is brought to atmospheric pressure in 10 seconds with heating lamp 31 off.

Stress is created during mounting and vacuum baking which can warp semiconductor wafer 12. Temperature changes and differing thermal expansion rates are a cause of warpage on semiconductor wafer 12. Wafer 12, uniform wax layer 14, and silicon wafer submount 17 each have a different thermal expansion coefficient. The dominant effect which stresses wafer 12 is the difference in thermal expansion rates of semiconductor wafer 12 and silicon wafer submount 17 as temperature changes. To reduce warpage due to differing thermal expansion rates the assembly is annealed. The anneal step comprises heating the assembly for 30 minutes at 90 degrees Celsius.

An alternative approach to minimizing this effect is to use a gallium arsenide wafer or thermally matched material as a submount. Both the submount and wafer 12 will expand and contract at the same rate minimizing warpage. Using a gallium arsenide wafer as a submount is not commonly done due to the high cost of the wafers. The gallium arsenide wafer should have a larger diameter and be able to withstand handling (not be chipped or otherwised compromised) if it is used as the submount. Both the submount and wafer 12 will expand and contract at the same rate minimizing warpage.

FIG. 4 is an illustration of the gallium arsenide wafer being ground down to a predetermined thickness by a grinding tool 19. Grinding tool 19 has a grinding surface 21 which contacts a surface of semiconductor wafer 12 to remove material. Arrows 22 and 23 indicate direction of movement of grinding tool 19 to make contact to a surface of wafer 12. Arrow 24 indicates that grinding tool 19 rotates to achieve a grinding action on the surface of semiconductor wafer 12. Silicon wafer submount 17 is mounted on vacuum chuck 25. To provide even grinding on semiconductor wafer 12, vacuum chuck 25 is rotated in an opposite direction of grinding tool 19 as indicated by arrow 26. Typically, vacuum chuck 25 is rotated at a much slower speed than grinding tool 19. There is no circuitry formed on the surface being ground. All circuitry is formed on the opposing surface of wafer 12 (the surface which interfaces with uniform wax layer 14).

During the grinding process, loose particles are abundant and heat is generated. Typically, a water based coolant is used to remove loose particles and dissipate heat. Waxivation (as disclosed above) is ideal for use with the water based coolant because it is not water soluble. Waxivation forms a bond between wafer 12 and submount 17 that withstands the stress of the grinding process and allows the use of the water based coolant.

Ideal target thickness for semiconductor wafer 12 is 102 microns. Several factors limit the amount of material which can be removed from semiconductor wafer 12. Grinding wafer material away forms defects on semiconductor wafer 12. These defects in semiconductor wafer 12 can affect performance of circuits, especially if allowed to penetrate into processed layers in which the circuits are formed such as an epi layer. Defects in the lattice structure also make semiconductor wafer 12 susceptible to fracturing. Removing approximately 511 microns from the original 625 micron thickness of wafer 12 leaves wafer 12 having a thickness of 114 microns. Lattice damage caused by grinding is a safe distance from circuitry previously formed on semiconductor wafer 12 at a wafer thickness of 114 microns.

Another factor which is also included when defining how much material can be removed from semiconductor wafer 12 is variations in thickness of the silicon wafer submount 17 and uniform wax layer 14. Typically, silicon wafer submount 17 will have a wafer thickness variation of plus or minus 3 microns. Uniform wax layer 14 has a variation of plus or minus 1 micron. Statistically, variations in thickness of the silicon wafer submount 17, uniform wax layer 14, and semiconductor wafer 12 can skew wafer 12 for grinding such that it is ground unevenly. Material is removed from semiconductor wafer 12 to increase thermal transfer from wafer 12. A slight variation in wafer thickness will not affect thermal transfer to any significant level.

Mentioned previously is the fact that grinding semiconductor wafer 12 leaves lattice damage and thus makes wafer 12 extremely weak. After grinding, a chemical etch is used to remove damaged material from semiconductor wafer 12. Approximately 12 microns of material is etched from semiconductor wafer 12 leaving wafer 12 at a thickness of 102 microns. The chemical etch has a secondary benefit of strengthening wafer 12 to allow handling of the thinned wafer after it is removed from submount 17.

FIG. 5 is an illustration of metal sputtered on semiconductor wafer 12. After thinning semiconductor wafer 12, a metal layer 27 is formed on the exposed wafer surface. Silicon wafer submount 17, uniform wax layer 14, and semiconductor wafer 12 are placed in a metal sputtering chamber 28. Metal layer 27 is deposited on semiconductor wafer 12 in metal sputtering chamber 28. Metal sputtering is a higher temperature wafer process step than metal evaporation. Previous attempts at using wax as a bonding material would use metal evaporation as a metallization process because previous waxes would liquify at temperatures needed to perform metal sputtering. Metal sputtering is the preferred metallization technique for applying metal layer 27 due to its better coverage. Insitu Argon sputter etch to clean surface of native oxides forms better back-metal adhesion than the metal evaporation technique. Waxivation, which is the wax used to form uniform wax layer 14 liquifies between 140-160 degrees Celsius. The high liquifying point of Waxivation allows metal sputtering to be used without destroying the bond formed by uniform wax layer 14.

FIG. 6 is an illustration of thinned semiconductor wafer 12 being removed from submount 17. Separation of semiconductor wafer 12 from silicon wafer submount 17 must not stress wafer 12 to minimize chance of breakage.

A heating plate 32 is built which conforms to the shape of silicon wafer submount 17. Heating plate 32 is used to heat silicon wafer submount 17 thereby heating uniform wax layer 14 until it softens and liquifies. Built into heating plate 32 is a vacuum hold down system for holding silicon wafer submount 17. Vacuum is not engaged until the wax is flowing or liquified. A ridge 33 is formed on heating plate 32 to hold submount 17 from moving laterally. The wax bond holding semiconductor wafer 12 weakens as uniform wax layer 14 is heated. A wafer removal tool 34 is used to push semiconductor wafer 12 onto a wafer platform 36.

In the preferred embodiment, wafer platform 36 is placed next to heating plate 32 and is built to a height which allows semiconductor wafer 12 to be pushed from silicon wafer submount 17 by wafer removal tool 34 without dropping a significant distance onto wafer platform 36. A surface 37 is made of a non-stick material such as tetrafluoroethylene to prevent residual wax on semiconductor wafer 12 from sticking to wafer platform 36. Cooling of wafer platform 36 may be necessary due to its close proximity to heating plate 32. Cooling wafer platform 36 also accelerates solidifying of any residual wax on semiconductor wafer 12 thereby reducing the tendency for wafer 12 to stick to the surface of wafer platform 36. Residual wax remaining on semiconductor wafer 12 is removed with solvent.

By now it should be appreciated that a semiconductor wafer wax mounting process has been described. A high temperature wax dissolved in solvent simplifies wax application to a semiconductor wafer or submount. Spinning the wax on a wafer forms a layer of wax with little variation in thickness. The wafer and wax is heated to remove any remaining solvent. The wax on the wafer is used to bond the wafer to a submount. The wafer, wax, and submount are heated in a vacuum to remove trapped air in the wax thereby forming a uniform wax bond. Stress induced by different material thermal expansion coefficients is minimized by annealing. The semiconductor wafer wax mounting process is strong enough to allow grinding to reduce wafer thickness, maintains a bond at temperatures approaching 130 degrees Celsius to allow high temperature wafer process steps to be used. Mounted wafers can be easily separated from a submount and residual wax on wafers is easily removed with solvent. All processes are suitable for high volume production environment.

We claim:

1. A semiconductor wafer mounting for thinning process comprising:
   providing a semiconductor wafer;
   providing a submount;
   placing a wax dissolved in solvent on one or both of the semiconductor wafer and the submount;
   spinning the semiconductor wafer or the submount having wax thereon to remove solvent and to spread the wax uniformly;
   heating the semiconductor wafer or the submount having wax thereon to remove solvent;
   bonding the semiconductor wafer to the submount, wherein the wax on the semiconductor wafer or the submount or on both forms a bond holding the semiconductor wafer to the submount;
   heating the submount, the wax, and the semiconductor wafer in a vacuum to remove air trapped in the wax; and
   cooling the submount, the wax, and the semiconductor wafer then annealing at atmospheric pressure, the submount, the wax, and the semiconductor wafer to reduce stress on the semiconductor wafer.

2. The semiconductor wafer mounting for thinning process of claim 1 wherein the placing a wax step includes providing a non-water soluble wax that liquifies between 140-160 degrees Celsius.

3. The semiconductor wafer mounting for thinning process of claim 1 wherein the providing a submount step includes providing a submount of material having a similar material thermal expansion coefficient as the semiconductor wafer.

4. The semiconductor wafer mounting for thinning process of claim 3 wherein the providing a submount step includes providing a silicon wafer having a diameter larger than the semiconductor wafer.

5. The semiconductor wafer mounting for thinning process of claim 4 wherein the first heating and bonding steps include:
   heating the silicon wafer;

centrally locating the semiconductor wafer with respect to the silicon wafer;

placing the semiconductor wafer onto the silicon wafer such that the wax on or both the semiconductor wafer and the submount forms a bond holding the semiconductor wafer to the silicon wafer; and removing wax which is pushed out from between the silicon wafer and the semiconductor wafer with solvent.

6. The semiconductor wafer mounting for thinning process of claim 1 further including:

grinding the bonded semiconductor wafer to reduce wafer thickness;

washing the bonded semiconductor wafer with a water based coolant during grinding to remove loose material and to dissipate heat from the semiconductor wafer;

chemically thinning the bonded semiconductor wafer;

depositing metal on the bonded semiconductor wafer;

placing the submount on a heated plate;

heating the submount until the wax bonding the semiconductor wafer thereto softens;

sliding the semiconductor wafer off the submount onto a surface of a wafer platform for handling the semiconductor wafer; and cleaning the semiconductor wafer of any remaining wax with a solvent.

7. The semiconductor wafer mounting for thinning process of claim 6 wherein placing the submount step includes placing the submount on a heated plate with a vacuum mount to hold the submount, the heated plate having a ridge which surrounds the submount, to hold the submount from moving laterally as the semiconductor wafer is removed from the submount, and wherein the sliding step includes coating the surface of the wafer platform with tetrafluoroethylene to prevent the semiconductor wafer from sticking to the surface and cooling the wafer platform surface.

8. A method for attaching a semiconductor wafer to a submount comprising:

providing a semiconductor wafer;

providing a semiconductor submount to be bonded to the semiconductor wafer;

forming a wax layer on one or both of the semiconductor wafer and the semiconductor submount;

coupling the semiconductor wafer and the semiconductor submount together, the wax layer on one or both the semiconductor wafer and the semiconductor submount being between the semiconductor wafer and the semiconductor submount;

heating the semiconductor wafer, the semiconductor submount, and the wax layer in a vacuum to remove trapped air in the wax layer, the wax layer bonding the semiconductor wafer to the semiconductor submount;

increasing pressure to approximately atmospheric pressure; and cooling the semiconductor wafer, the semiconductor submount, and the wax layer then annealing the semiconductor submount, the wax layer, and the semiconductor wafer to reduce stress on the semiconductor wafer.

9. The method for attaching a semiconductor wafer to a submount of claim 8 wherein the forming step includes:

placing wax on one or both the semiconductor wafer and the submount;

spinning the semiconductor wafer or the submount having wax thereon, to spread the wax uniformly on the surface thereof; and heating the semiconductor wafer or the submount having wax thereon to remove solvent.

10. The method for attaching a semiconductor wafer to a submount of claim 9 wherein the forming step includes placing the semiconductor wafer on the submount such that on the semiconductor wafer or the submount having wax thereon bonds the semiconductor wafer to the submount.

11. The method for attaching a semiconductor wafer to a submount of claim 8 wherein the providing a submount step includes providing a silicon wafer as the submount wherein the silicon wafer has a larger diameter than the semiconductor wafer.

12. The method for attaching a semiconductor wafer to a submount of claim 8 further including:

grinding the semiconductor wafer to reduce wafer thickness;

chemically thinning the semiconductor wafer to reduce damage and to strengthen the semiconductor wafer;

applying metal on the semiconductor wafer;

separating the semiconductor wafer from the submount; and removing residual wax from the semiconductor wafer.

13. The method for attaching a semiconductor wafer to a submount of claim 12 further including:

placing the submount on a heated plate;

heating the submount to soften the wax bonding the semiconductor wafer to the submount;

sliding the semiconductor wafer off the submount onto a platform, wherein the platform has a non-stick surface.

14. A method for mounting and thinning a gallium arsenide wafer, the method comprising:

providing a gallium arsenide wafer;

providing a silicon wafer as a submount, said silicon wafer having a diameter at least as large as said gallium arsenide wafer;

placing a wax dissolved in solvent on one or both of said gallium arsenide wafer and said submount;

spinning said gallium arsenide wafer or said submount having wax thereon to remove solvent and to spread the wax uniformly;

heating said silicon wafer or said submount having wax thereon to further remove solvent;

bonding said gallium arsenide wafer to said submount, wherein said wax on said gallium arsenide wafer or said submount or on both forms a bond holding said gallium arsenide wafer to said submount;

heating said submount, said wax, and said gallium arsenide wafer in a vacuum to remove air trapped in said wax;

cooling said submount, said wax, and said gallium arsenide wafer; and increasing pressure to approximately atmospheric then annealing said submount, said wax, and said gallium arsenide wafer to reduce stress on said gallium arsenide wafer.

15. A method as recited in claim 14 further including thinning said gallium arsenide wafer;

heating said submount to heat said wax;

sliding said gallium arsenide wafer on a non-stick surface; and removing said wax from said gallium arsenide wafer.

* * * * *